(12) United States Patent
Härle et al.

(10) Patent No.: US 6,529,028 B1
(45) Date of Patent: Mar. 4, 2003

(54) CONFIGURATION FOR TESTING A PLURALITY OF MEMORY CHIPS ON A WAFER

(75) Inventors: Dieter Härle, München (DE); Patrick Heyne, München (DE); Martin Buck, München (DE)

(73) Assignee: Infineon Technologies AG, München (DE)

( * ) Notice: Subject to any disclaimer, the term of this patent is extended or adjusted under 35 U.S.C. 154(b) by 0 days.

(21) Appl. No.: 09/302,649

(22) Filed: Apr. 30, 1999

(30) Foreign Application Priority Data

Apr. 30, 1998 (DE) .......................................... 198 19 570

(51) Int. Cl.$^7$ ............................................. G01R 31/28
(52) U.S. Cl. ..................... 324/758.1; 324/754
(58) Field of Search ............................. 324/158.1, 765, 324/763, 754, 755, 757, 537, 72.5; 317/22.4; 371/15.1, 22.5, 22.6

(56) References Cited

U.S. PATENT DOCUMENTS

| | | | | |
|---|---|---|---|---|
| 4,961,053 A | * | 10/1990 | Krug ........................ 324/158.1 |
| 5,053,700 A | * | 10/1991 | Parrish ..................... 324/158.1 |
| 5,418,452 A | * | 5/1995 | Pyle ......................... 324/158.1 |
| 5,442,282 A | * | 8/1995 | Rostoker et al. ......... 324/158.1 |
| 5,608,335 A | * | 3/1997 | Tailliet ....................... 324/763 |
| 5,648,661 A | * | 7/1997 | Rostoker et al. .............. 257/48 |

FOREIGN PATENT DOCUMENTS

DE         19630316 A1      1/1998

* cited by examiner

*Primary Examiner*—Michael Sherry
*Assistant Examiner*—Jimmy Nguyen
(74) *Attorney, Agent, or Firm*—Laurence A. Greenberg; Werner H. Stemer; Ralph E. Locher

(57) ABSTRACT

A configuration for testing a plurality of memory chips on a wafer, in which needles are used to supply the memory chips with supply voltages, an initialization signal, a read signal, a clock signal as well as address, data and control signals. The address, data and control signals are in this case produced by a logic device disposed in an edge area of the memory chip and are supplied directly to the memory chips.

4 Claims, 1 Drawing Sheet

CONFIGURATION FOR TESTING A PLURALITY OF MEMORY CHIPS ON A WAFER

BACKGROUND OF THE INVENTION

Field of the Invention

The present invention relates to a configuration for testing a plurality of memory chips on a wafer, in which needles are used to supply the memory chips with supply voltages, an initialization signal, a read signal, a clock signal as well as address, data and control signals.

Until now, chips of, for example, 64 Mbit DRAMs have been tested in small groups by needles from needle cards. In the process, problems have arisen in producing a needle card with sufficient needles for the needles to make contact with a large number of chips, preferably all the chips on the wafer, for a test run.

The maximum number of needles on a needle card at the moment is about 1000 needles. This allows testing of the order of magnitude of about 20 to 50 chips, since different address, data supply and control signals must be supplied to each individual chip via the needles.

Known configurations thus provide needle cards with up to 1,000 needles, by which about 20 to 50 chips can be tested at the same time. The relatively high contact pressure that is exerted by the 1,000 needles on the 20 to 50 chips is also problematic in this case. Furthermore, it is difficult to configure the tips of the needles to be in the same plane when there are such a large number of needles for each chip. The number being in the order of magnitude of 50 needles per chip, so that each individual chip on the wafer can be tested reliably.

SUMMARY OF THE INVENTION

It is accordingly an object of the invention to provide a configuration for testing a plurality of memory chips on a wafer which overcomes the above-mentioned disadvantages of the prior art devices of this general type, in which it is possible to test significantly more memory chips than in the past in one test run with one needle card.

With the foregoing and other objects in view there is provided, in accordance with the invention, an improved configuration for testing a plurality of memory chips having edge areas and disposed on a wafer, the improvement includes: a logic device outputting at least some address signals, data signals and control signals directly received by the plurality of memory chips under test, the logic device disposed on an edge area of the plurality of memory chips disposed on the wafer; and a plurality of needles supplying supply voltages, an initialization signal, a read signal, and a clock signal to the plurality of memory chips under test.

The object is achieved according to the invention in the case of the configuration of the type mentioned initially in that at least some of the address, data and control signals are produced in a logic device disposed in the edge area (sawn edge containing test structures and centering aids for the masks) of the memory chip and are supplied directly to the memory chips. In this case, all the address, data and control signals are preferably produced in the logic device provided in the edge area. It should be mentioned that the term a plurality of memory chips is also intended to include individual memory chips, for example two memory chips separated by an edge area.

The invention thus adopts a completely different approach than the previous prior art. Instead of aiming to achieve improvements in the needle cards or needles, which would occur in any case in the course of development, a separate logic device is accommodated in the edge area of the memory chip, with whose aid address, data and control signals are produced locally in the edge area of each memory chip, and are supplied directly to the memory chip. This has the major advantage that only supply voltages and a few coded output signals then need to be supplied via the needle card for each memory chip. Therefore, only five contact points are now required via the needle card, for the supply voltages, an initialization signal, a read signal and a clock signal, so that up to 200 chips can be tested with one needle card having about 1,000 needles.

The local logic device, which is located in the edge area, for the individual memory chips thus produces all the address, data and control signals that are required and evaluates them. If a fault occurs, then a fault signal is emitted which indicates to the test set that a fault has occurred. Appropriately coded signals can be used to determine directly where the fault is located. For example, two coded signals are required for this purpose for four word lines that are boosted simultaneously. The exact fault location can then be defined from the time when a fault occurred and the n coded signals.

Other features which are considered as characteristic for the invention are set forth in the appended claims.

Although the invention is illustrated and described herein as embodied in a configuration for testing a plurality of memory chips on a wafer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The single FIGURE of the drawing is a diagrammatic, plan view of a memory chip with an edge area according to the invention.

DESCRIPTION OF THE PREFERRED EMBODIMENTS

Figure 1:
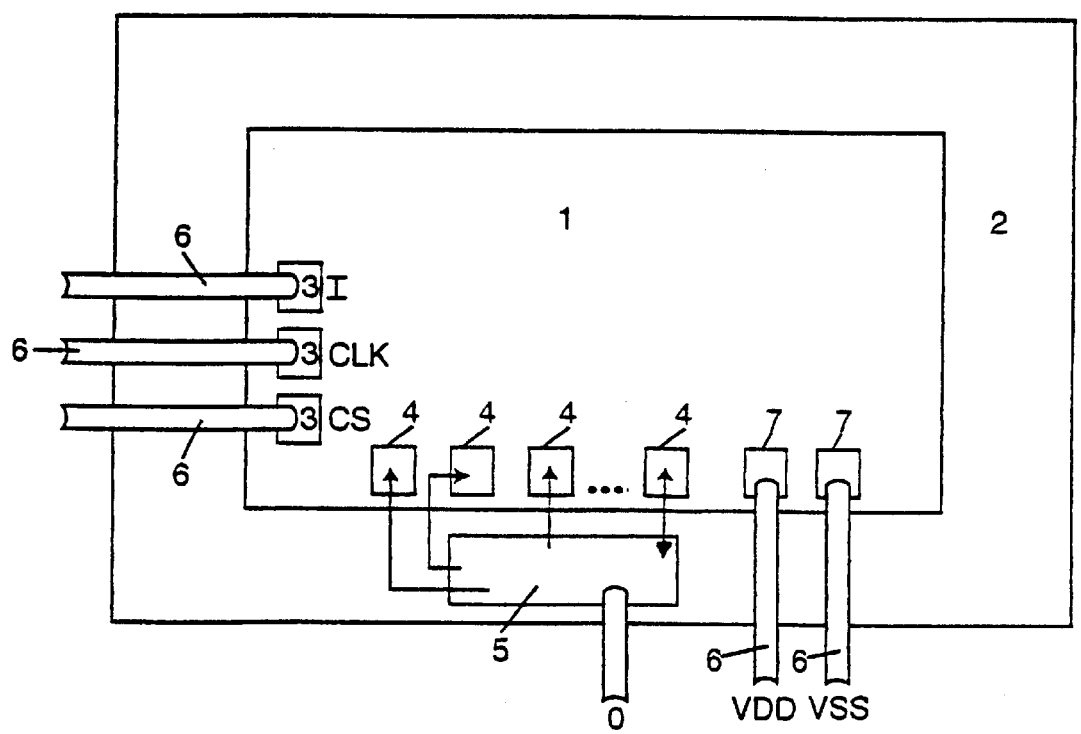

Referring now to the single FIGURE of the drawing in detail, there is shown a memory chip 1, which is surrounded by an edge area or sawn edge 2. The edge area 2 is discarded when the wafer is broken up into the individual memory chips 1 by sawing, so that only the individual memory chips 1 remain after the breaking up process, without the edge area 2.

The memory chip 1 is provided with various pads (contact points) 3, 4, 7, which make contact with needles 6 of a test card while testing is being carried out. The pads 3 are thus provided for an initialization signal I, a clock signal CLK and a select signal CS and the pads 7 are provided for supply voltages VDD and VSS. Furthermore, the memory chip 1 has the pads 4, which make contact with needles for address, data and control signals. For simplicity, the FIGURE shows only three such pads 4, although, for example, eleven address signals, eight to sixteen data signals and five control signals must in fact be applied for a test run. A multiplicity of needles 6 are thus required, as has already been mentioned above, so that only a relatively small number of memory chips in a group can be tested together with a needle card having about 1,000 needles.

Now, according to the invention, a logic device 5 is provided in the edge area 2, and is connected to an output O and emits the address, data and control signals directly to the pads 4. No more needles 6 are thus required for the pads 4, so that the number of needles 6 required for testing the memory chip 1 can be considerably reduced.

The needles 6 are only shown diagrammatically and actually run essentially at right angles to the plane of the drawing towards the pads 3.

The logic device 5 thus carries out the function of testing with the address, data and control signals, so that the total number of needles 6 required is reduced to a corresponding extent. It is, of course, also possible to supply only some of the signals via the logic device 5 to the memory chip 1.

After the test run, the edge area 2 is removed by sawing, as a result of which the logic device 5, which is then no longer required, is also cut off.

The invention thus uses the space provided by the edge area in an advantageous manner in order, with the aid of the logic device 5, to ensure a reduction in the number of needles 6 required in this case.

If required, the logic device 5 can also be disposed in the edge area 2 such that it supplies a plurality of semiconductor chips with the corresponding address, data and control signals so that, for example, one logic device 5 is assigned to two or even more memory chips 1.

It is also possible in the configuration according to the invention to increase the number of needles 6 on a needle card, since the needles 6 themselves can be disposed further away from one another, this being based on the fact that fewer needles 6 are required for the individual memory chips 1.

We claim:

1. An improved configuration for testing a plurality of memory chips having edge areas and pads and disposed on a wafer, the improvement comprising:
   a logic device outputting at least some address signals, data signals and control signals directly received by the plurality of memory chips under test, said logic device disposed on an edge area of the plurality of memory chips disposed on the wafer; and
   a plurality of contact needles of a test device contacting at least some of the pads of the plurality of memory chips only during testing, supplying supply voltages, an initialization signal, a read signal, and a clock signal to the plurality of memory chips under test.

2. The configuration according to claim 1, wherein said plurality of needles supply additional address signals, additional data signals and additional control signals to the plurality of memory chips under test.

3. The configuration according to claim 1, wherein said logic device produces all of the address signals, the data signals and the control signals necessary for testing the plurality of memory chips.

4. The configuration according to claim 1, wherein said edge area is formed by a sawn edge to be discarded when the wafer is divided into the plurality of memory chips.

* * * * *